US012628434B2

(12) United States Patent
Mallikarjunaswamy et al.

(10) Patent No.: US 12,628,434 B2
(45) Date of Patent: May 12, 2026

(54) LOW CAPACITANCE HIGH HOLDING VOLTAGE TRANSIENT VOLTAGE SUPPRESSING DEVICE

(71) Applicant: Alpha and Omega Semiconductor International LP, Toronto (CA)

(72) Inventors: Shekar Mallikarjunaswamy, San Jose, CA (US); Juan Luo, San Jose, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 536 days.

(21) Appl. No.: 18/134,829

(22) Filed: Apr. 14, 2023

(65) Prior Publication Data

US 2024/0347527 A1 Oct. 17, 2024

(51) Int. Cl.
*H10D 89/60* (2025.01)

(52) U.S. Cl.
CPC ......... *H10D 89/713* (2025.01); *H10D 89/611* (2025.01)

(58) Field of Classification Search
CPC ....... H10D 89/713; H10D 89/611; H02H 9/04
See application file for complete search history.

(56) References Cited

U.S. PATENT DOCUMENTS

| | | | |
|---|---|---|---|
| 11,990,467 B2 | 5/2024 | Mallikarjunaswamy et al. | |
| 2018/0342499 A1* | 11/2018 | Mallikarjunaswamy | .................... H10D 89/611 |
| 2021/0407987 A1* | 12/2021 | Shen | ...................... H02H 9/046 |
| 2024/0332954 A1* | 10/2024 | Russ | ...................... H02H 9/005 |

OTHER PUBLICATIONS

Jung, Jin-woo. "Design of SCR-Based ESD Protection Circuit for 3.3 V I/O and 20 V Power Clamp" ETRI Journal, vol. 37, No. 1 available at http://dx.doi.org/10.4218/etrij.15.0114.0730 dated Feb. 2015.

* cited by examiner

*Primary Examiner* — Marlon T Fletcher
*Assistant Examiner* — Samuel Jonathan Smith
(74) *Attorney, Agent, or Firm* — JDI PATENT; Joshua D. Isenberg

(57) ABSTRACT

A transient voltage suppressing (TVS) device including a first silicon-controlled rectifier and a voltage clamp having a first terminal and a second terminal. The first terminal is connected to a cathode of the first silicon-controlled rectifier.

15 Claims, 8 Drawing Sheets

LOW CAPACITANCE HIGH HOLDING VOLTAGE TRANSIENT VOLTAGE SUPPRESSING DEVICE

FIELD OF THE DISCLOSURE

Aspects of the present disclosure relate to transient voltage suppressing (TVS) devices, specifically aspects of the present disclosure relate to low capacitance high voltage transient voltage suppressing devices.

BACKGROUND OF THE DISCLOSURE

TVS devices may use the snap back voltage of a bipolar transistor, or silicon-controlled rectifier (SCR) to shunt high voltage transients away from more delicate circuitry. The snap back voltage is the voltage at which the avalanche breakdown or impact ionization occurring within the transistor (or rectifier) provides sufficient current to turn the transistor to the "on" state allowing current to flow freely through the transistor. In some TVS devices snap back voltage may be chosen that is less than the voltage spike tolerance of a device connected to the channel of the TVS such that the TVS device triggers when the snapback voltage is exceeded thus protecting the connected devices. Thus the snapback voltage of the TVS may be referred to as the trigger voltage as it is the voltage that triggers the TVS, Transistors or rectifiers in a TVS device may have a high trigger voltage creating a circuit where reverse voltage is normally blocked until a sufficiently high voltage spike occurs switching the TVS device on and shunting current away from the connected device. The holding voltage in a TVS device is the minimum voltage that must be maintained through the TVS device to remain in the on state after a transient voltage spike. A high holding voltage is needed in some applications to avoid system latch up.

Conventional low capacitance high holding voltage TVS devices are realized by connecting a low capacitance forward diode (known as High Side Steering diode-HS) in series with a high reverse blocking large area/cap diode clamp. This reverse blocking clamp can be constructed using an avalanche diode, PNP, NPN or SCR device. The Low Side (LS) diode required for ESD conduction is constructed using a low cap/area steering diode that is in parallel with the HS diode in series with the large area diode clamp. Consequently, the holding voltage is determined by the snap-back voltage of corresponding NPN, PNP or SCR device and the blocking capability of their breakdown voltage. In this configuration, it is difficult to independently scale the reverse breakdown voltage and the intrinsic snap-back voltage of the TVS as they are interdependent.

It is within this context that aspects of the present disclosure arise.

BRIEF DESCRIPTION OF THE DRAWINGS

The teachings of the present disclosure can be readily understood by considering the following detailed description in conjunction with the accompanying drawings, in which.

DESCRIPTION OF THE SPECIFIC EMBODIMENTS

Figure 1A:
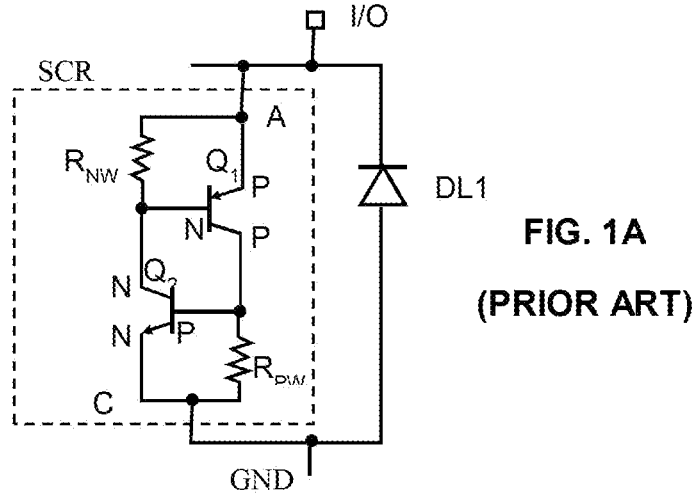
FIG. 1A is an equivalent circuit diagram of a Prior Art unidirectional TVS device.

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The disclosure herein refers to a semiconductor material, such as silicon, doped with ions of a first conductivity type or a second conductivity. The ions of the first conductivity type may be opposite ions of a second conductivity type. For example, and without limitation, ions of the first conductivity type may be n-type, which create charge carriers when doped into silicon. Ions of the first conductivity type include phosphorus, antimony, bismuth, lithium and arsenic. Ions of the second conductivity may be p-type, which create holes for charge carriers when doped into silicon and in this way are referred to as being the opposite of n-type. P-type type ions include boron, aluminum, gallium and indium. While the above description referred to n-type as the first conductivity type and p-type as the second conductivity the disclosure is not so limited, p-type may be the first conductivity and n-type may be second the conductivity type, Furthermore, semiconductor materials other than silicon may be used in TVS devices in accordance with aspects of the present disclosure.

In the following Detailed Description, reference is made to the accompanying drawings, which form a part hereof, and in which are shown by way of illustration specific embodiments in which the invention may be practiced. For convenience, use of + or − after a designation of conductivity or net impurity carrier type (p or n) refers generally to a relative degree of concentration of designated type of net impurity carriers within a semiconductor material. In general, terms, an n+ material has a higher n type net dopant (e.g., electron) concentration than an n material, and an n material has a higher carrier concentration than an n-material. Similarly, a p+ material has a higher p type net dopant (e.g., hole) concentration than a p material, and a p material has a higher concentration than a p− material. It is noted that what is relevant is the net concentration of the carriers, not necessarily dopants. For example, a material may be heavily doped with n-type dopants but still have a relatively low net carrier concentration if the material is also sufficiently counter-doped with p-type dopants. As used herein, a concentration of dopants less than about $10^{18}/cm^3$ may be regarded as "lightly doped" and a concentration of dopants greater than about $10^{18}/cm^3$ may be regarded as "heavily doped".

Operation of a conventional TVS device may be appreciated by referring to the equivalent circuit diagram shown in FIG. 1A. The illustrated TVS device includes a P-N junction diode DL1 connected in a forward direction between a channel (I/O terminal) and ground potential. That is, the anode of the diode DL1 is connected to the ground node and the cathode of the diode DL1 is connected to the channel. Diode DL1 functions as the low-side steering diode of the TVS device. The TVS device includes the SCR device connected in parallel with the P-N junction diode DL1. In particular, the SCR device can be represented as two back-to-back connected PNP and NPN bipolar transistors. The anode of the SCR device is the P-type emitter of the PNP bipolar transistor which is also connected to the N-type base through the base resistance RNW. The cathode of the SCR device is the N-type emitter of the NPN bipolar transistor which is connected to ground potential and to the N-type base of the NPN bipolar transistor through the base resistance RPW. As thus configured, contributions to the parasitic capacitance of the TVS device at the channel (I/O terminal) are mainly from the N-type region of the P-N junction diode DL1 and the anode of the SCR device.

Figure 1B:
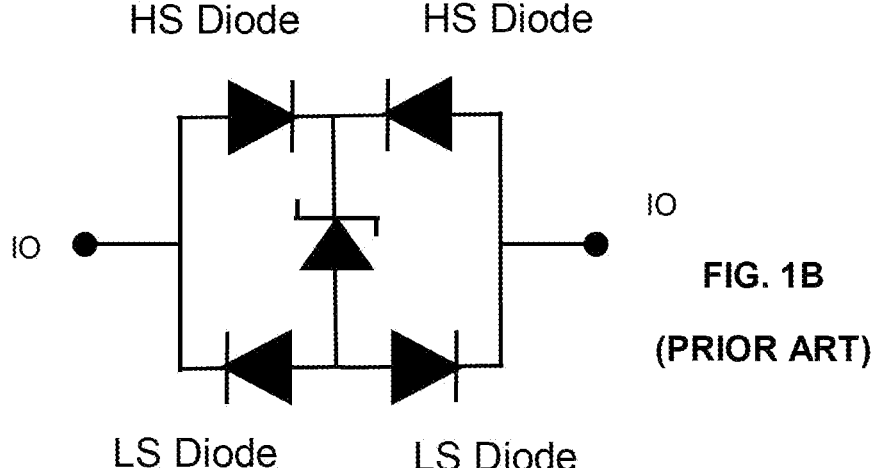
FIG. 1B is a circuit diagram of a layout of a prior art bidirectional high holding voltage TVS device.

In prior art configurations of TVS devices, such as that shown in FIG. 1B, two or more channels (I/O terminals) may be coupled together with one of the channels (I/O terminals) acting as the ground potential. Each channel (I/O) terminal) may be coupled to a reverse diode and a forward diode arranged in parallel. A voltage clamp may be mounted in series between the forward diode and the reverse diode. That is the anode of the forward diode is connected to a first terminal of the voltage clamp and the cathode of the reverse diode is connected to a second terminal of the voltage clamp. The voltage clamp shown is a Zener diode or Avalanche diode. In the implementation shown in FIG. 1B the first terminal of the avalanche diode is the anode and the second terminal is the cathode. Other implementations may use, a SCR, a NPN transistor or a PNP transistor. As discussed above, in this prior art implementation it is difficult to independently scale the reverse breakdown voltage and the intrinsic snap-back voltage of the TVS as they are interdependent.

Figure 2A:
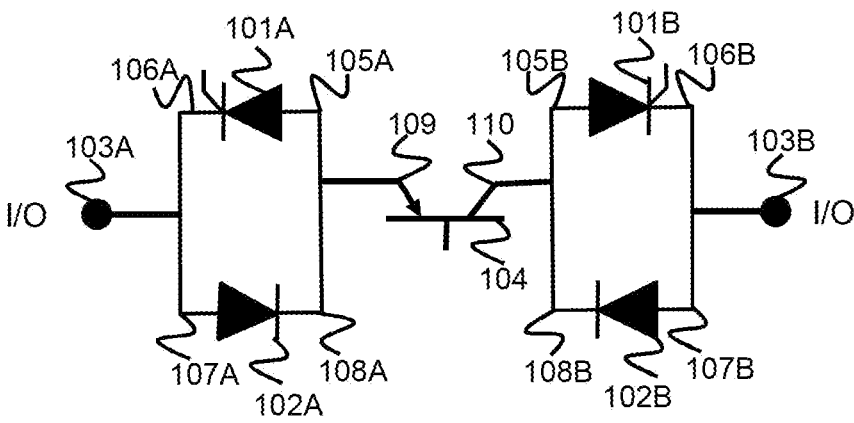
FIG. 2A is a circuit diagram depicting the improved TVS device according to aspects of the present disclosure.

FIG. 2A is a circuit diagram depicting an improved TVS device according to aspects of the present disclosure. In the implementation shown the TVS device includes two I/O terminals 103A, 103B connected in a symmetric configuration through a voltage clamp 104. The voltage clamp 104 is depicted as a PNP transistor. The voltage clamp may be any suitable switching component configured to allow current to travel through the device with a low impedance and clamp the voltage drop once a target voltage has been reached, it is also desirable that the voltage clamp blocks current after the voltage at a terminal is below the target voltage. The voltage clamp may be, for example and without limitation, a PNP transistor, an NPN transistor, or a SCR. The voltage clamp may have a high holding voltage and the present configuration allows for adjustment of the holding voltage without affecting the breakdown voltage of the forward SCR by selection of desired properties of the voltage clamp. As used herein a high holding voltage may be 3 to 300 volts or more. In some implementations the holding voltage may be from 10 volts to 12 volts. In some additional implementations the holding voltage may be adjustable through selection of the appropriate doping concentrations. This allows for independent scaling of the trigger voltage and the holding voltage of the improved TVS. Meaning that a TVS device with high holding voltage can be manufactured by creating an SCR component with a high breakdown voltage and a voltage clamp component with the desired holding voltage characteristics. As such the breakdown voltage of the SCR components are higher than holding voltage of the voltage clamp allowing the SCR to trigger during a transient voltage spike higher than a chosen trigger voltage. The holding voltage is the holding point potential that maintains device in on-state. For example and without limitation, the holding voltage of the voltage clamp may be designed to be around 12 volts. The low side diode may have a forward bias voltage of around 1 volt and the breakdown voltage of the SCR components may be designed to be 5 volts to 500 volts.

The first I/O terminal 103A is connected to a first SCR 101A and a first diode 102A with the first SCR 101A in parallel with the first diode 102A. The first SCR 101A is connected in a reverse-bias configuration with respect to the first I/O terminal 103A. The cathode of the first SCR 106A is connected to the first I/O terminal 103A and the anode of the first diode 107A. The first diode 102A is arranged in forward-biased configuration with respect to the first I/O terminal 103A. The cathode of the first diode 107A is connected to the anode of the second SCR 105A and the first I/O terminal 109 of the voltage clamp 104. The anode of the first diode 107A is also connected to the first I/O terminal 103A. The anode of the first SCR 105A is also connected to the first terminal 109 of the voltage clamp. Each terminal (except a gate or body, if present) of the voltage clamp is connected to a SCR and a diode. The second terminal 110 of the voltage clamp is connected to the second SCR 101B and the second diode 102B. The second I/O terminal 103B is connected to a second SCR 101B and a second diode 102B with the second SCR 101B in parallel with the second diode 102B. The second SCR 101B is connected in reverse-bias configuration with respect to the second I/O terminal 103B.

The cathode of the second SCR 106B is connected to the second I/O terminal 103B and the anode of the second diode 107B. The second diode 102B is arranged in forward-bias configuration with respect to the second I/O terminal 103B. The cathode of the second diode 102B is connected to the anode of the second SCR 105B and a second terminal 110 of the voltage clamp 104. The anode of the second diode 107B is also connected to the second I/O terminal 103B. The anode of the second SCR 105B is also connected to the second terminal 110 of the voltage clamp 104.

Figure 2B:
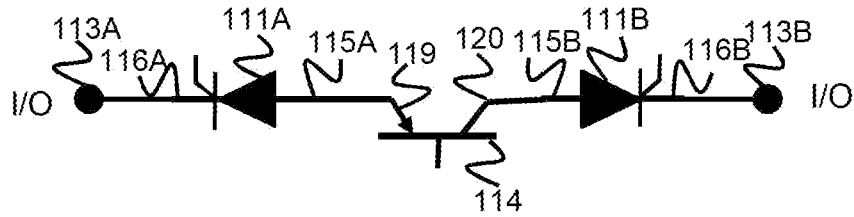
FIG. 2B is a circuit diagram depicting the improved TVS using an intrinsic diode of the SCR instead of a low side diode according to aspects of the present disclosure.

Use of an intrinsic diode of the SCR may provide a reduction in components, added circuit simplicity and a reduction in junction capacitance. FIG. 2B is a circuit diagram depicting the improved TVS using an intrinsic diode of the SCR instead of a low side diode according to aspects of the present disclosure. It should be noted that in this implementation SCR components must be chosen that are configured to include an intrinsic diode. This implementation includes a first I/O terminal 113A and a second I/O terminal 113B that are conductively coupled through a voltage clamp 114. The first I/O terminal 113A is connected to the cathode 116A of the first SCR 111A. The first SCR is arranged in the re-verse configuration with respect to the first I/O terminal 113A. The anode 115A of the first SCR 111A is connected to the first terminal 119 of the voltage clamp 114. The second SCR 111B is arranged in a reverse conducting configuration with respect to the second I/O terminal 113B. The second terminal 120 of the voltage clamp 114 is connected to the anode 115B of the second SCR 111B. The cathode 116B of the second SCR 111B is connected to the second I/O terminal 113B. The intrinsic diode in the selected SCR allows reverse current to flow through the SCR. Once the current drops below a holding current the SCR begins limiting current in the reverse direction.

Figure 2C:
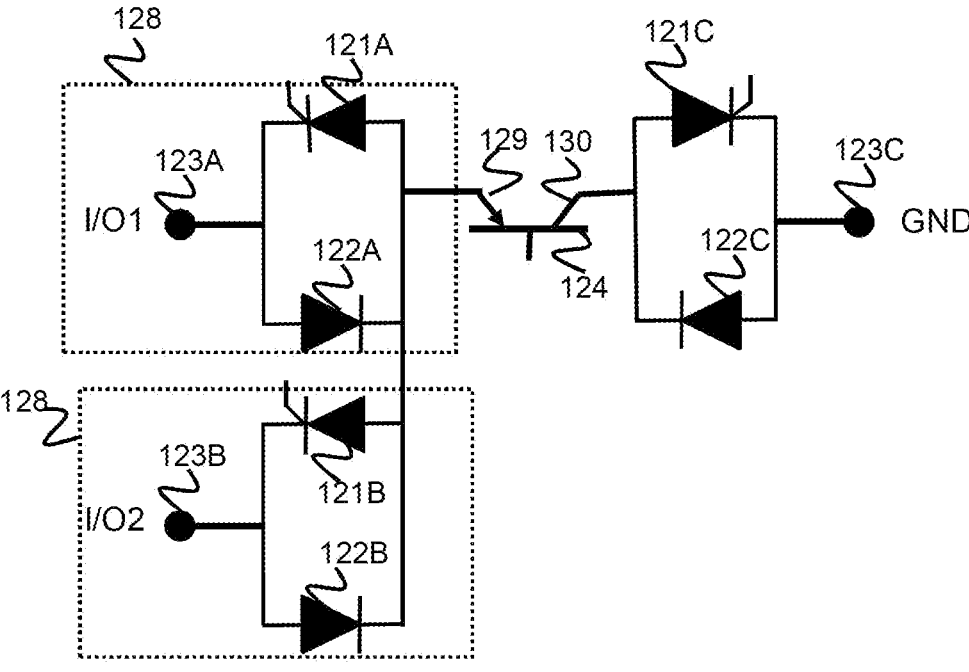
FIG. 2C is a circuit diagram of the improved high holding voltage TVS device having two channels according to aspects of the present disclosure.

While FIG. 2A and FIG. 2B show implementations of a bi-directional one channel TVS device, aspects of the present disclosure are not so limited. Any number of channels may be added to the TVS device. FIG. 2C is a circuit diagram of the improved bi-directional TVS device having two channels according to aspects of the present disclosure. The implementation shown includes an I/O terminal designated as a grounded terminal 123C. The grounded terminal 123C is located on one side of the voltage clamp 124 and the other I/O terminals 123A, and 123B are located on the other side of the clamp 124. This allows the voltage to be balanced between the other I/O terminal 123A, 123B and the grounded terminal 123C. As shown the first I/O terminal is connected to a first SCR 121A and a first diode 122A. The first SCR 121A and first diode 122A are connected in parallel with the first SCR 121A in a reverse-bias configuration and the diode 122A in a forward-bias configuration with respect to the first I/O terminal 123A. The second I/O terminal 123B is connected to a second SCR 121B and a second diode 122B. The second SCR 121B and second diode 122B are connected in parallel with the second SCR 121B in a reverse-bias configuration and the second diode 122B in a forward-bias configuration with respect to the second I/O terminal 123B. The first SCR 121A, second SCR 121B, first diode 122A and second diode 122B are all connected to the first terminal 129 of the voltage clamp 124. The first SCR 121A, second SCR 121B, first diode 122A and second diode 122B are connected to each other in parallel. The grounded node 123C is connected to a third SCR 121C and a third diode 122C. The third SCR 123C and third diode 122C are connected in parallel with the third SCR 121C in a reverse-bias configuration with respect to the grounded node 123 and the third diode 122C is connected in forward-bias configuration with respect to the grounded node 123C. Both the third SCR 121C and the third diode 122C are connected to the second terminal 130 of the voltage clamp 124. This implementation allows any number of sets 128 of channels with SCR and diode to be added to the terminal side of the voltage clamp not connected to the grounded node.

Figure 2D:
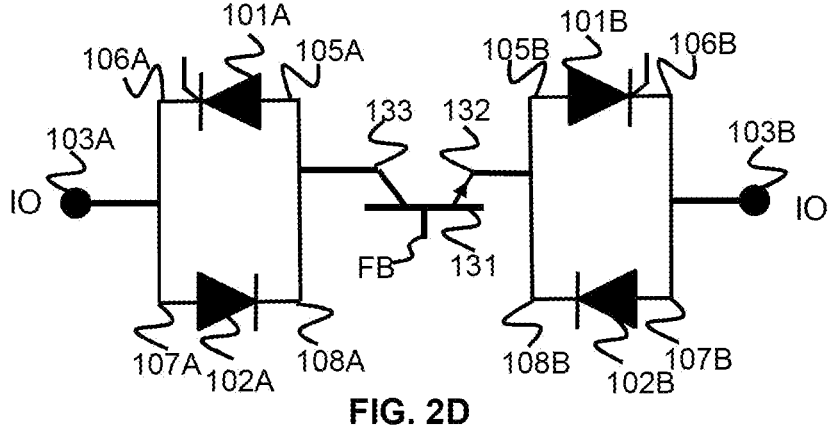
FIG. 2D is a circuit diagram of the improved high holding voltage TVS device having an NPN transistor acting as the voltage clamp according to aspects of the present disclosure.

FIG. 2D is a circuit diagram of the improved TVS device having an NPN transistor acting as the voltage clamp according to aspects of the present disclosure. In the implementation shown the voltage clamp is an NPN transistor 131. The NPN transistor 131 has a floating base FB and the first terminal of the voltage clamp is the NPN transistor collector 133. The second terminal of the voltage clamp is the NPN transistor emitter 132. As shown the NPN transistor collector 133 is connected to the first SCR anode 105A and the first diode cathode 108A. The NPN transistor emitter 132 is connected to the second SCR anode 105B and the second diode cathode 108B.

Figure 2E:
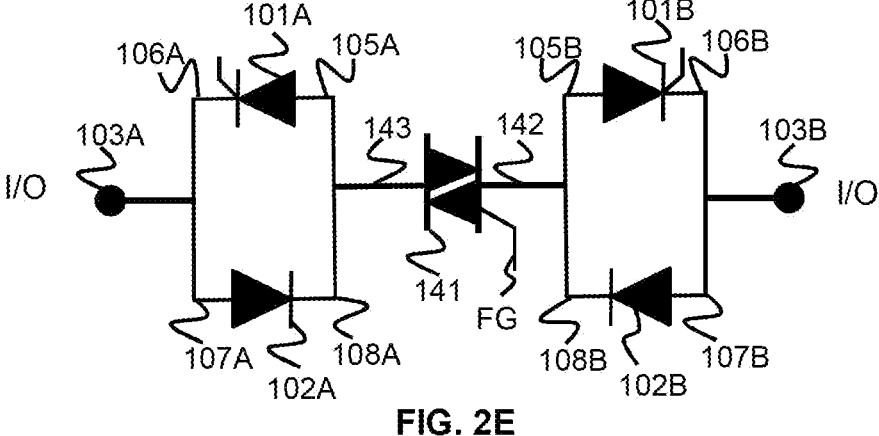
FIG. 2E is a circuit diagram of the improved high holding voltage TVS device having an SCR acting as the voltage clamp according to aspects of the present disclosure.

FIG. 2E is a circuit diagram of the improved TVS device having an SCR acting as the voltage clamp according to aspects of the present disclosure. In the implementation shown the voltage clamp is a symmetrical SCR 141. The symmetrical SCR 141 has a floating gate FG and the first terminal 143 of the symmetrical SCR 141 is connected to the first SCR anode 105A and the first diode cathode 108A. The second terminal 142 of the symmetrical SCR 141 is connected to the second SCR anode 105B and the second diode cathode 108B.

Details of the construction of TVS devices according to aspects of the present disclosure may be appreciated by referring to the cross-sectional diagrams depicted in FIG. 3, and FIG. 4 through FIG. 7.

Figure 3:
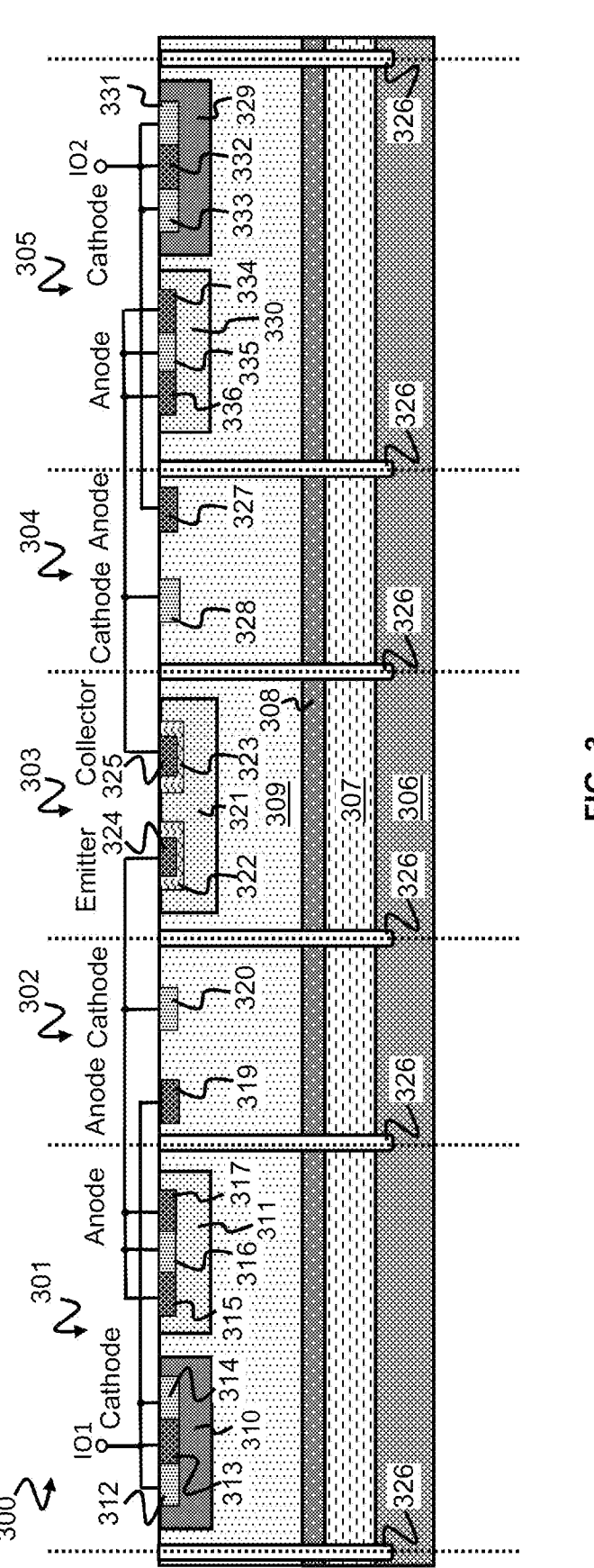
FIG. 3 is a vertical cross section diagram of the improved high holding voltage TVS device with HS SCR and LS diodes according to aspects of the present disclosure.

FIG. 3 is a vertical cross section diagram of an improved TVS device with HS SCR and LS diode according to an aspect of the present disclosure. As used herein a low capacitance for a diode may be less than or equal to 0.1 Pico Farad (pF). As shown, the TVS device 300 may include a first SCR component area 301 and a first LS diode component area 302 on the same substrate composition. The TVS device 300 may also include a voltage clamp component area 303 on the substrate composition with the first SCR component area 301 and the first LS diode component area 302. Additionally, the TVS device 300 may include a second LS diode component area 304 and a second SCR component area 305 on the same substrate composition as the first SCR component area 301, first LS diode component area 302 and voltage clamp component area 303. Each component may be separated in the substrate composition by a divider region 326 which may be a buffer space filled with a gas or other insulator. The gas may be a gas with a high resistivity at normal temperature and pressure for example and without limitation, air, nitrogen, noble gasses, etc. The other insulator may be for example and without limitation silicon dioxide. The substrate composition may include a substrate layer 306 made of a semiconducting material, such as silicon, heavily doped with ions having a second conductivity type. In the example shown the second conductivity type is P type and the first conductivity type is N type. A semiconducting epitaxial layer 307 doped with ions of the second conductivity type is disposed on top of the substrate layer 306. The epitaxial layer may be formed via any suitable method for epitaxy for example and without limitation chemical or physical vapor deposition. A base layer 308 heavily doped with ions of the first conductivity type is formed on top of the epitaxial layer. The base layer 308 may be created by any suitable doping method for example and without limitation ion implantation. A deep well region (also referred to as the N-epitaxial layer) 309 is located on top of the base layer 308 and lightly doped with ions of the first conductivity. The deep well region 309 may be formed by any suitable method for epitaxial growth for example and without limitation Chemical vapor deposition or physical vapor deposition.

The first SCR component area 301 includes a first SCR P-well region 310 doped with P-type ions and a first SCR N-well region 311 doped with N-type ions. The cathode of the first SCR is formed in the P-well region 310 with first SCR cathode N regions 312 and 314 heavily doped with N type ions and a first SCR cathode P region 313 heavily doped with P-type ions. The dopant concentration of the first SCR N-well region 311 and first SCR P-well region 310 respectively may for example and without limitation range from $5e^{15}$ cm$^{-3}$ to $1e^{18}$ cm$^{-3}$ and the regions may be implanted with energy of implantation of between 25 KeV and 3 MeV or more. The first SCR cathode N regions 312 and 314 and the first SCR cathode P region 313 may for example and without limitation have dopant concentration of between $1e^{18}$ cm$^{-3}$ and $1 e^{21}$ cm$^3$ and may be implanted with an energy of implantation of between 25 KeV and 100 KeV. The first SCR cathode N regions 312 and 314 are a part of the multi-finger symmetric structure of the SCR which places N regions on both sides of a P region and is conductively coupled with the first SCR cathode P region 313 as well as the first I/O terminal IO1. The anode of the first SCR is formed in the first SCR N-well region 311 from a first SCR anode N region 316 heavily doped with N-type ions and first SCR anode P regions 315 and 317 heavily doped with P-type ions. The first SCR anode N region 316 and the first SCR anode P regions 315 and 317 may for example and without limitation have dopant concentration of between $1e^{18}$ cm$^{-3}$ and $1e^{21}$ cm$^{-3}$ and may be implanted with an energy of implantation of between 25 KeV and 100 KeV. The first SCR P+ regions 315 and 317 forms part of the multi-finger symmetric structure and is conductively coupled to the first SCR anode with the first SCR anode N region 316. The first SCR P+ region is heavily doped with P-type ions. The breakdown voltage of the first SCR component may be chosen by selection of the appropriate doping concentrations and doping appropriate portions of various regions that comprise the SCR component. For example and without limitation, a break down voltage of 7 Volts may be obtained by creation of a trigger region with P region with a dopant concentration of $2.4e^{13}$ cm$^{-3}$ near a side of the P-well regions and creation of N region with a dopant concentration of $1e^{20}$ cm$^{-3}$ near a side of the N-well regions. The created P region and created N region may overlap with each other. The distance between the created P region and created N region may also be changed to further influence the breakdown voltage of the SCR. Each of the regions in the SCR component area may be formed by any suitable doping method for example and without limitation ion implantation. While the present disclosure presents an SCR with regions labeled P and N a person of ordinary skill in the art would recognize that the dopant types for each region may be inversed (P for N and vice versa) without a loss of function of the SCR.

The first LS diode component area 302 includes a first LS diode anode region 319 heavily doped with ions of the second conductivity type. The first LS diode cathode region 320 is formed in the deep well region 309 of the first LS diode component area 302 and heavily doped with ions of the first conductivity type. A conductive contact to the first LS diode cathode region 320 may form the cathode of the first LS diode and a conductive contact to the first LS diode anode region 319 may form the anode of the first LS diode.

The voltage clamp component area 303 shown in this implementation is a PNP transistor. As discussed above the voltage clamp may be a PNP transistor, NPN transistor or SCR. The voltage clamp component area may include a voltage clamp well region 321 doped with the first conductivity type formed in the deep well region 309 of the substrate composition. The voltage clamp well region 321 may act as the base for the PNP transistor or the NPN transistor. A first terminal region 322 may be formed in the well region 321 and doped with ions of the first conductivity type. The doping concentration of the first terminal region 322 may be between $5e^{15}$ cm$^{-3}$ and $1e^{18}$ cm$^{-3}$ and may be doped to a depth from of less than 1 micrometer (μm) to as deep as the bottom of the deep well region 309.

As noted above, the present configuration allows for adjustment of the holding voltage without affecting the breakdown voltage of the forward SCR by selection of desired properties of the voltage clamp. For example, where the voltage clamp component is a PNP on NPN transistor, the holding voltage is mostly determined by the PNP or NPN breakdown voltage, which is determined by the doping concentration of the base region 321 and the size and doping concentration of P regions 322 and 323. The spacing between 322 and 323 also affects the holding voltage, e.g., punch through may occur with a sufficiently small spacing. Adjusting the breakdown voltage can adjust the holding voltage of the whole TVS device.

A first terminal contact region 324 may be formed in the first terminal region 322 and may be heavily doped with ions of the second conductivity type. The first terminal region 322 and the first contact terminal region 324 form the first terminal of the voltage clamp and in a PNP or NPN transistor, the regions may either form the emitter or collector of the voltage clamp component area 303. The first terminal contact region 324 may be conductively coupled with the LS diode cathode contact region 320 of the first LS diode component area 302 and the anode N-contact region 317 of the first SCR component area 301. A second terminal region 323 doped with ions of the second conductivity type may be formed in the voltage clamp well region 321. A second terminal contact region 325 may be formed in the second terminal region 323 and heavily doped with ions of the second conductivity type. The second terminal region 323 and the second terminal contact region 325 form the second terminal of the voltage clamp component area 303. The second terminal may either be the emitter or collector of the voltage clamp if the voltage clamp component is a PNP or NPN transistor.

The second terminal of the voltage clamp component area may be conductively coupled to an anode of the second LS diode component area 304 and an anode of the second SCR component area 305. For the improved device, the trigger voltage or holding voltage controls the operation. The trigger voltage is determined by the sum of the trigger voltage of the SCR and the breakdown voltage of the PNP or NPN transistor. The trigger voltage of the SCR may be adjusted to change the trigger voltage of the whole TVS device, and the breakdown voltage of the voltage clamp may be chosen to adjust the holding voltage of the whole TVS device.

The second LS diode component area 304 includes a second LS diode anode region 327 heavily doped with ions of the second conductivity type. The second LS diode cathode region 328 is formed in the deep well region 309 of the second LS diode component area 304 and heavily doped with ions of the first conductivity type. A conductive contact to the second LS diode cathode region 320 may form the cathode of the second LS diode and a conductive contact to the second LS diode anode region 319 may form the anode of the second LS diode area 304.

The second SCR component area 305 includes a second SCR P-well region 329 doped with P-type ions and a second SCR N-well region 330 doped with N-type ions. The cathode of the second SCR is formed in the second SCR P-well region 329 with a second SCR cathode N+ regions 331 and 333 heavily doped with N-type ions and a second SCR cathode P region 332 heavily doped with P-type ions. The dopant concentration of the second SCR N-well region 330 and second SCR P-well region 329 respectively may for example and without limitation range from $5e^{15}$ cm$^{-3}$ to $1e^{18}$ cm$^{-3}$ and the regions may be implanted with energy of implantation of between 25 KeV and 3 MeV or more. The second SCR cathode N regions 331 and 333 and the second SCR cathode P region 332 may for example and without limitation have dopant concentration of between $1e^{18}$ cm$^{-3}$ and $1e^{21}$ cm$^{-3}$ and may be implanted with an energy of implantation of between 25 KeV and 100 KeV. The second SCR N+ regions 331 and 333 in this implementation are part of the multi-finger symmetric structure and are conductively coupled with the second SCR cathode P region 332 as well as the second I/O terminal IO2. The anode of the second SCR is formed in the second SCR N-well region 330 from a second SCR anode N region 335 heavily doped with N-type ions and a second SCR anode P+ region 336 heavily doped with P-type ions. The second SCR anode N region 335 and the second SCR anode P+ region 334 and 336 may for example and without limitation have dopant concentration of between $1e^{18}$ cm$^{-3}$ and $1e^{21}$ cm$^{-3}$ and may be implanted with an energy of implantation of between 25 KeV and 100 KeV. The second SCR P+ region 334 and 336 form part of the multi-finger symmetric structure and are conductively coupled to the second SCR cathode with the second SCR cathode N region 335. The breakdown voltage of the second SCR component may be chosen by selection of the appropriate doping concentrations for the various regions that comprise the SCR component. In the implementations discussed, the different regions of each device that are said to be connected may be connected by, for example and without limitation, a top metal layer, metal leads, wires or similar electrically conductive elements.

In an alternative implementation a P-type deep well 309 may be used without a substantial change in function with minor modifications as will be discussed. In such an implementation that conductivity types of the first and second SCR well regions, first and second SCR gate region, first and second SCR anode regions, and first and second SCR cathode regions may have their conductivity types changed from N-type to P-type or P-type to N-type. Likewise, the first and second LS diode cathode regions, first and second LS diode anode regions and first and second LS diode well region (if present) may have their conductivity types changed from N-type to P-type or P-type to N-type. Finally, the NBL layer may be omitted. With these modifications the device may operate with a P-type deep well region instead of an N-type deep well region.

Figure 4:
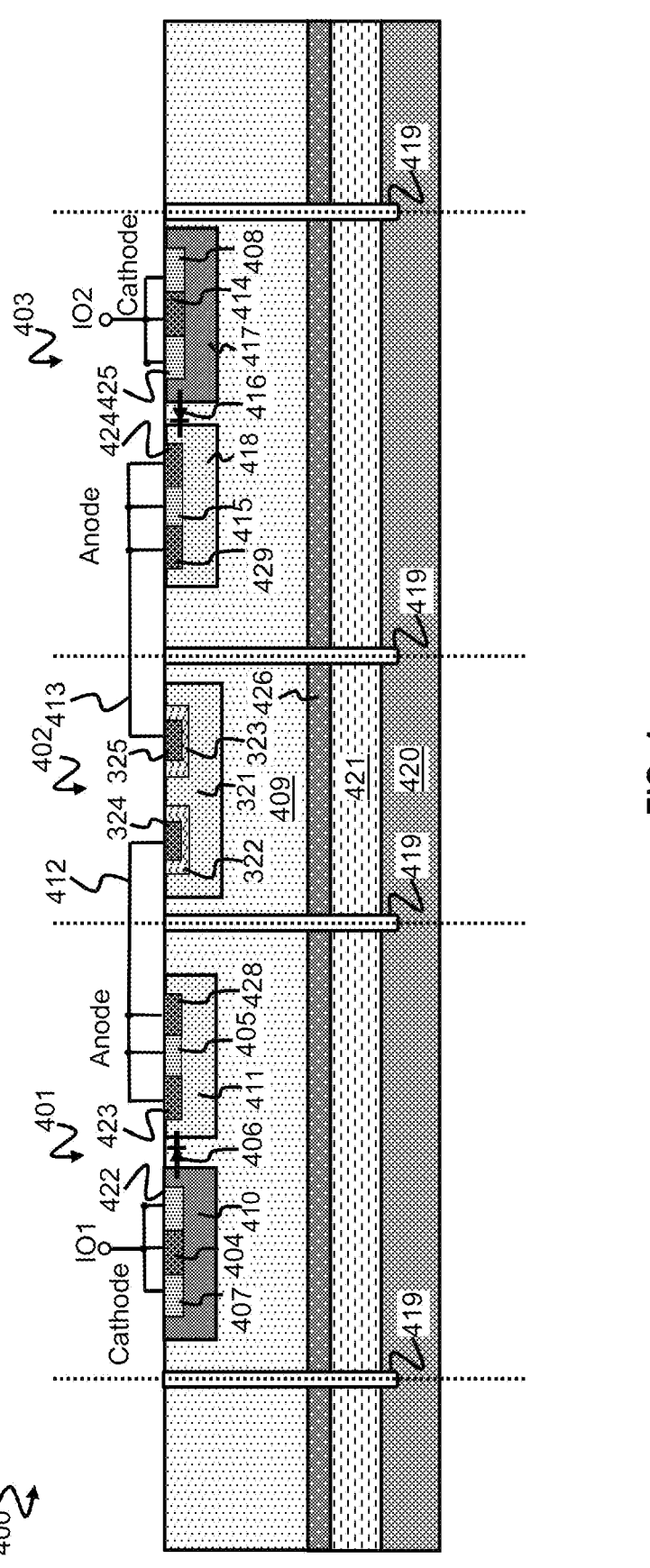
FIG. 4 is a vertical cross section diagram of the improved high holding voltage TVS device having two SCR device component regions and using the intrinsic diode of the SCR for reverse conduction according to aspects of the present disclosure.

FIG. 4 is a vertical cross section diagram of the improved TVS device having two SCR device component regions and using the intrinsic diode of the SCR for reverse conduction according to aspects of the present disclosure. This implementation of the improved TVS device does not include a separate LS diode component region connected to the SCR and voltage clamp. Instead, a first intrinsic diode 406 in the first SCR component area 401 provides reverse conduction for the first IO of the TVS device and a second intrinsic diode 416 in the second SCR component area 403 provides reverse conduction for the second IO of the TVS device. The capacitance of the first intrinsic diode 406 may be adjusted by scaling the overall size and different doped regions within the first SCR component area 401. Similarly the capacitance of the second intrinsic diode 416 may be adjusted by scaling the overall size and different regions within the second SCR component area 403. For example increasing the size of the SCR component areas and the different regions within the SCR component areas will increase the capacitance. The TVS device 400 includes a first SCR component area 401, a voltage clamp 402 and a second SCR component 403. The substrate composition of this implementation includes a semiconductor substrate layer 420 heavily doped with ions of the second conductivity type. Unlike the implementation shown in FIGS. 3A and 3B, divider regions 419 in this implementation separate the first SCR component area 401 from the voltage clamp 402 and the second SCR region 403 from the voltage clamp 402.

Similar to FIGS. 3A and 3B an epitaxial layer 421 doped with ions of the second conductivity type is disposed on top of the substrate layer 420. A buried layer 426 is formed in a top layer of the epitaxial layer and heavily doped with ions of the first conductivity type. A deep well region 409 doped with ions of the first conductivity type is formed on top of the buried layer 426.

The first SCR component area 401 has a similar layout to the first SCR component area shown in FIG. 3. That is, the first SCR area includes a first SCR P-well region 410 heavily doped with ions of P-type and a first SCR N-well region 411 heavily doped with ions of N-type formed in the deep well region 409. The N-well region 411 is more heavily doped with ions N-type ions than the deep well region 409. The first SCR cathode includes a first SCR cathode P region 404 heavily doped with P-type ions and first SCR cathode N regions 407, and 422 heavily doped with N-type ions. The dopant concentration of the first SCR N-well region 411 and first SCR P-well region 410 respectively may for example and without limitation range from $5e^{15}$ cm$^{-3}$ to $1e^{18}$ cm$^{-3}$ and the regions may be implanted with energy of implantation of between 25 KeV and 3 MeV or more. The first SCR cathode N regions 407 and 422 and the first SCR cathode P region 408 may for example and without limitation have dopant concentration of between $1e^{18}$ cm$^{-3}$ and $1e^{21}$ cm$^{-3}$ and may be implanted with an energy of implantation of between 25 KeV and 100 KeV. The first SCR cathode N regions 407 and 422 are a part of the multi-finger symmetric structure of the SCR which places N regions on both sides of a P region and is conductively coupled with the first SCR cathode P region 404 as well as the first I/O terminal I/O1. The First SCR anode includes a First SCR anode P regions 428, and 423 heavily doped with P-type ions and a First SCR anode N region 405 heavily doped with N-type ions formed in the First SCR N-well region 411. The first SCR anode N region 405 and the first SCR anode P regions 428 and 423 may for example and without limitation have dopant concentration of between $1e^{18}$ cm$^{-3}$ and $1e^{21}$ cm$^{-3}$ and may be implanted with an energy of implantation of between 25 KeV and 100 KeV. The first SCR anode P regions 423 and 428 are a part of the multi-finger symmetric structure of the SCR which places P regions on both sides of a N region and is conductively coupled with the first SCR anode N region 405 as well as the a first terminal 412 of the voltage clamp.

The First SCR anode is connected to a first terminal 412 of the voltage clamp 402. The first SCR cathode is connected to the first I/O terminal IO1.

The second SCR component area 403 has a similar layout to the second SCR component area shown in FIG. 3. That is, the second SCR component area includes a first SCR P-well region 417 doped with ions of the P-type and a second SCR N-well region 418 heavily with ions of the N-type formed in the deep well region 409. The N-well region 418 is more heavily doped with ions of the N-type than the deep well region 409. The second SCR cathode includes a second SCR anode P region 414 heavily doped with P-type ions and second SCR cathode N regions 408, and 425 heavily doped with N-type ions. The dopant concentration of the second SCR N-well region 418 and second SCR P-well region 417 respectively may for example and without limitation range from $5e^{15}$ $cm^{-3}$ to $1e^{18}$ $cm^{-3}$ and the regions may be implanted with energy of implantation of between 25 KeV and 3 MeV or more. The second SCR cathode N regions 408 and 425 and the first SCR cathode P region 414 may for example and without limitation have dopant concentration of between $1e^{18}$ $cm^{-3}$ and $1e^{21}$ $cm^{-3}$ and may be implanted with an energy of implantation of between 25 KeV and 100 KeV. The second SCR cathode N regions 408 and 425 are a part of the multi-finger symmetric structure of the SCR which places N regions on both sides of a P region and is conductively coupled with the first SCR cathode P region 414 as well as the second I/O terminal I/O2. The second SCR anode includes second SCR anode P regions 429, and 424 heavily doped with P-type ions and a second SCR cathode N region 415 heavily doped with N-type ions formed in the second SCR N-well region 418. The second SCR anode N region 415 and the second SCR anode P regions 429 and 424 may for example and without limitation have dopant concentration of between $1e^{18}$ $cm^{-3}$ and $1e^{21}$ $cm^{-3}$ and may be implanted with an energy of implantation of between 25 KeV and 100 KeV. The second SCR anode P regions 429 and 424 are a part of the multi-finger symmetric structure of the SCR which places P regions on both sides of a N region and is conductively coupled with the first SCR anode N region 415 as well as the a second terminal 413 of the voltage clamp. The second SCR anode is connected to a second terminal 413 of the voltage clamp 402. The second SCR cathode is connected to the second I/O terminal IO2.

Figure 5:
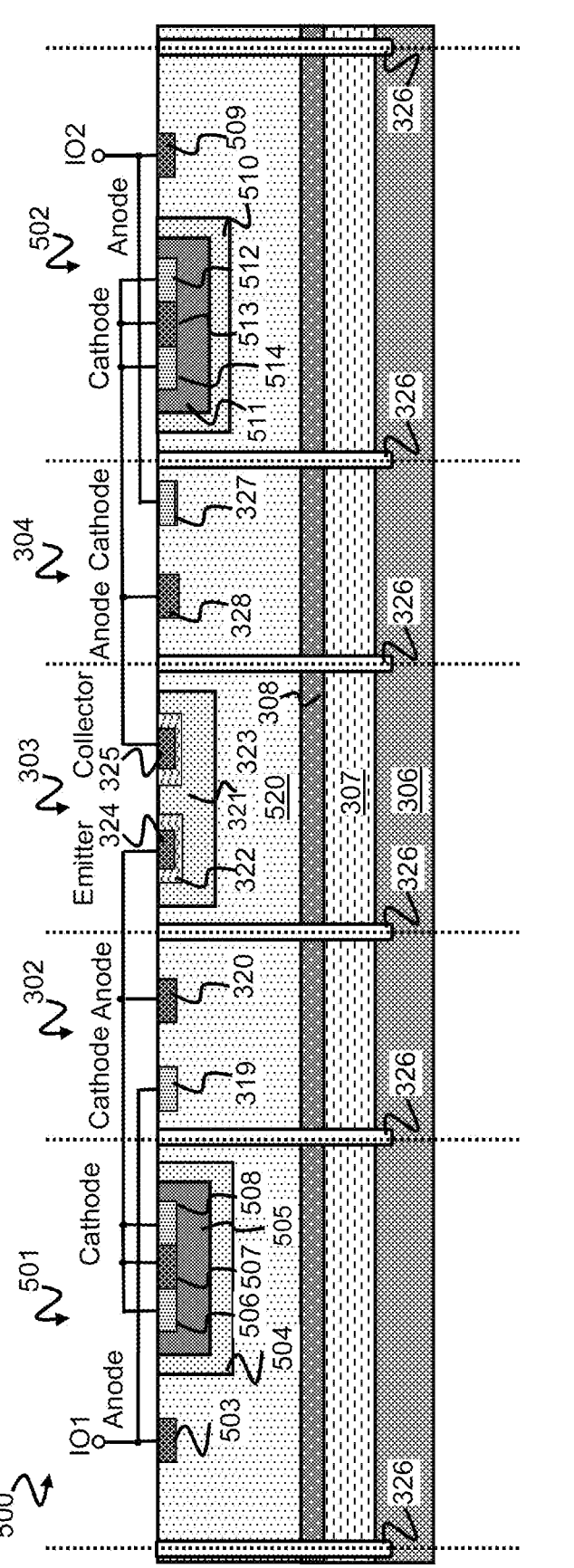
FIG. 5 is a vertical cross section diagram of the improved high holding voltage TVS device having a different SCR layout according to aspects of the present disclosure.

FIG. 5 is a vertical cross section diagram of the improved TVS device having a different SCR layout according to aspects of the present disclosure. In the implementation shown the TVS device 500 includes a first SCR component area 501. The first SCR cathode includes a single first SCR anode P-contact (P+) region 503 formed in the deep well region 520 of the substrate composition and heavily doped with N-type ions. The first SCR anode P-contact region 503 is connected to the first I/O terminal IO1 and the cathode of the first diode 302. A first SCR N-well region 504 is formed in the deep well region 520 of the substrate composition and doped with N-type ions. In this implementation a first SCR P-Well region 505 is doped with P-type ions and formed in the first SCR N-well region 504. The first SCR cathode is formed from a first SCR cathode P region 507 and a first SCR cathode N+ region 506 and 508. The first SCR cathode P region 507 is formed in the First SCR P-well region 505 and heavily doped with P-type ions. The first SCR anode N+ region 506 and 508 are formed in the first SCR P-well region 505 and heavily doped with N-type ions. The multi-finger symmetric structure of the first SCR is created with a first SCR cathode region 506 and 508 formed in the P-well region 505 and heavily doped with N-type ions. The N region 506 and 508 is connected to the First SCR cathode P region 507. The first SCR cathode is connected to the anode of the first LS diode 302 and a first terminal of the voltage clamp 303.

The second SCR component area 502 mirrors the first SCR component area 501. The second SCR anode includes a single second SCR anode P-contact (P+) region 509 formed in the deep well region 520 of the substrate composition and heavily doped with P-type ions. The second SCR anode P-contact region 509 is connected to the second I/O terminal IO2 and the cathode of the second LS diode component area 304. A second SCR N-well region 510 is formed in the deep well region 520 of the substrate composition and doped with N-type ions. In this implementation a second SCR P-Well region 511 is doped with P-type ions and formed in the second SCR N-well region 510. The second SCR cathode is formed from a second SCR cathode P-Contact region 513 and a second SCR cathode N region 512 and 514. The second SCR anode P region 513 is formed in the second SCR P-well region 511 and heavily doped with P-type ions. The second SCR cathode N-gate region 512 and 514 are formed in the second SCR P-well region 511 and heavily doped with N-type ions. The multi-finger symmetric structure of the second SCR is created with multiple anode and cathode regions. The second SCR cathode N region 512 and 514 is connected to the second SCR P-contact region 513. The second SCR cathode is connected to the anode of the second LS diode component area 304 and a second terminal of the voltage clamp 303.

Figure 6:
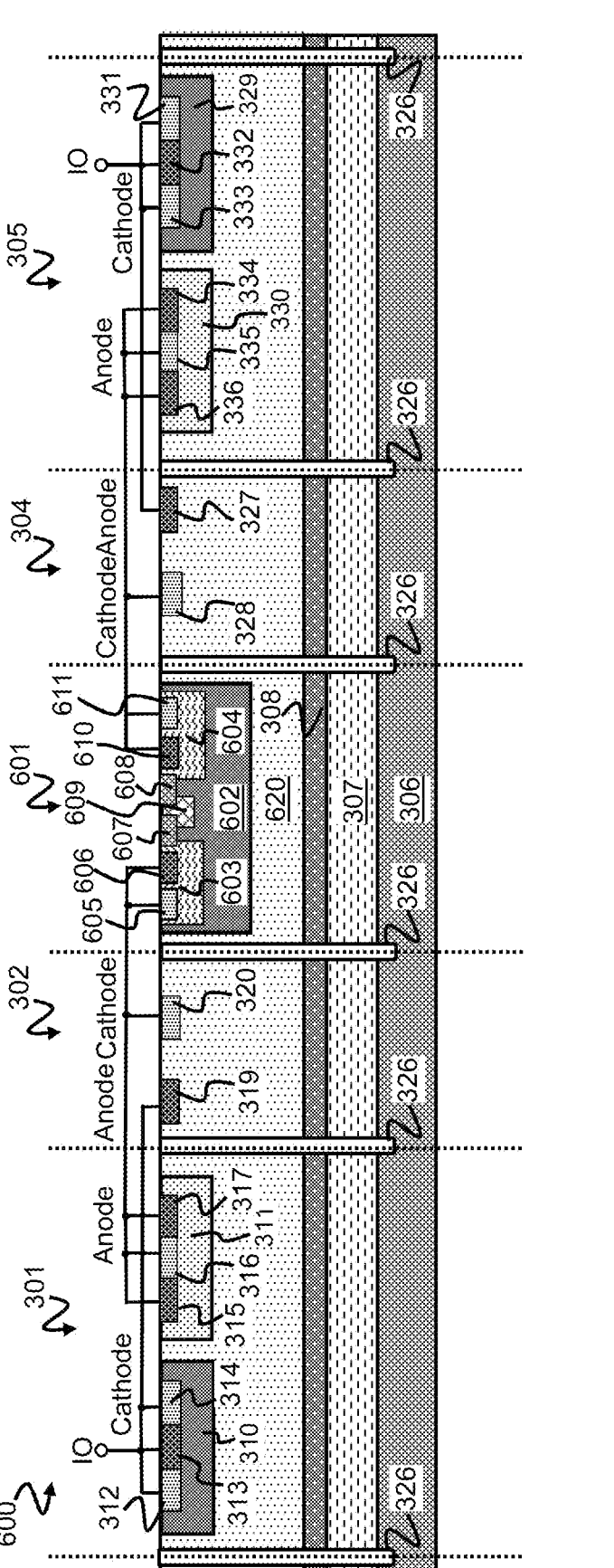
FIG. 6 is a vertical cross section diagram of the improved high holding voltage TVS device having a voltage clamp that is a symmetrical SCR according to aspects of the present disclosure.

FIG. 6 is a vertical cross section diagram of the improved TVS device having a voltage clamp that is a symmetrical SCR according to aspects of the present disclosure. As discussed above the voltage clamp may be an NPN transistor, PNP transistor or an SCR. In the implementation shown the voltage clamp 601 is a symmetrical SCR. The Symmetrical SCR includes a voltage clamp deep well region 602 that is heavily doped with ions of the second conductivity type. The voltage clamp deep well region 602 is formed in the substrate deep well region 620 (also referred to as the N-epitaxial layer). A first terminal of the symmetrical SCR voltage clamp 601 includes a first voltage clamp N-contact region 605 and a first voltage clamp P-contact (P+) region 606 formed in a first N-well region 603. The first voltage clamp N-well region 603 may be doped with N-type ions and formed in the voltage clamp deep well region 602. The first voltage clamp P-contact region 606 may be formed in the first voltage clamp N-well region 603 and heavily doped with P-type ions. The first voltage clamp N-contact region 605 may be formed in the first voltage clamp N-well region 603 and heavily doped with N-type ions. The first terminal of the voltage clamp is connected to the cathode of the first diode and the anode of the first SCR via for example and without limitation a top metal layer, metal leads, wires or similar electrically conductive elements.

A second terminal of the symmetrical SCR voltage clamp 601 includes a first voltage clamp N-contact region 611 and a first voltage clamp P-contact region 610 formed in a second N-well region 603. The second voltage clamp N-well region 603 may be doped with N-type ions and formed in the voltage clamp deep well region 602. The second voltage clamp P-contact (P+) region 610 may be formed in the second voltage clamp N-well region 604 and heavily doped with P-type ions. The second voltage clamp N-contact region 611 may be formed in the second voltage clamp N-well region 604 and heavily doped with N-type ions.

The second terminal of the voltage clamp is connected to the cathode of the second diode and the anode of the second SCR via for example and without limitation a top metal layer, metal leads, wires or similar electrically conductive elements.

The trigger of the symmetrical SCR voltage clamp 601 includes a trigger P-well region 609, a first voltage clamp trigger region 607, and a second voltage clamp trigger region 608. The first voltage clamp trigger region 607 is doped with ions of the first conductivity type and partially located in the First N-well region 603, voltage clamp deep well region 602 and trigger P-well region 609. The second voltage clamp trigger region 608 is doped with ions of the first conductivity type and partially located in the second N-well region 604, voltage clamp deep well region 602 and trigger P-well region 609. The trigger P-well region 609 is more heavily doped with P-type ions than the voltage clamp deep well region 602 and formed within the voltage clamp deep well region 602. The trigger voltage of the whole device is determined by the trigger voltage of SCR directly connected to the IO as well as the SCR structure in the middle. The trigger voltage of the whole TVS device can be adjusted by adjusting the SCR directly connecting to the IO. The holding voltage of the whole TVS device can be adjusted by the middle SCR structure. The trigger voltage of the SCR is determined by the doping concentration of the trigger P-well region 609 and the size and doping concentration of the first voltage clamp trigger regions 607 and the second voltage clamp trigger region 608. The spacing between 607 and 608 also affects the trigger voltage, e.g., punch through may occur with a sufficiently small spacing. The holding voltage of the middle SCR structure is affected by the well doping concentration of 603 and 604 and spacing between 603 and 604, the well doping concentration of 609, as well the spacing between 605 and 606, spacing between 610 and 611.

Figure 7:
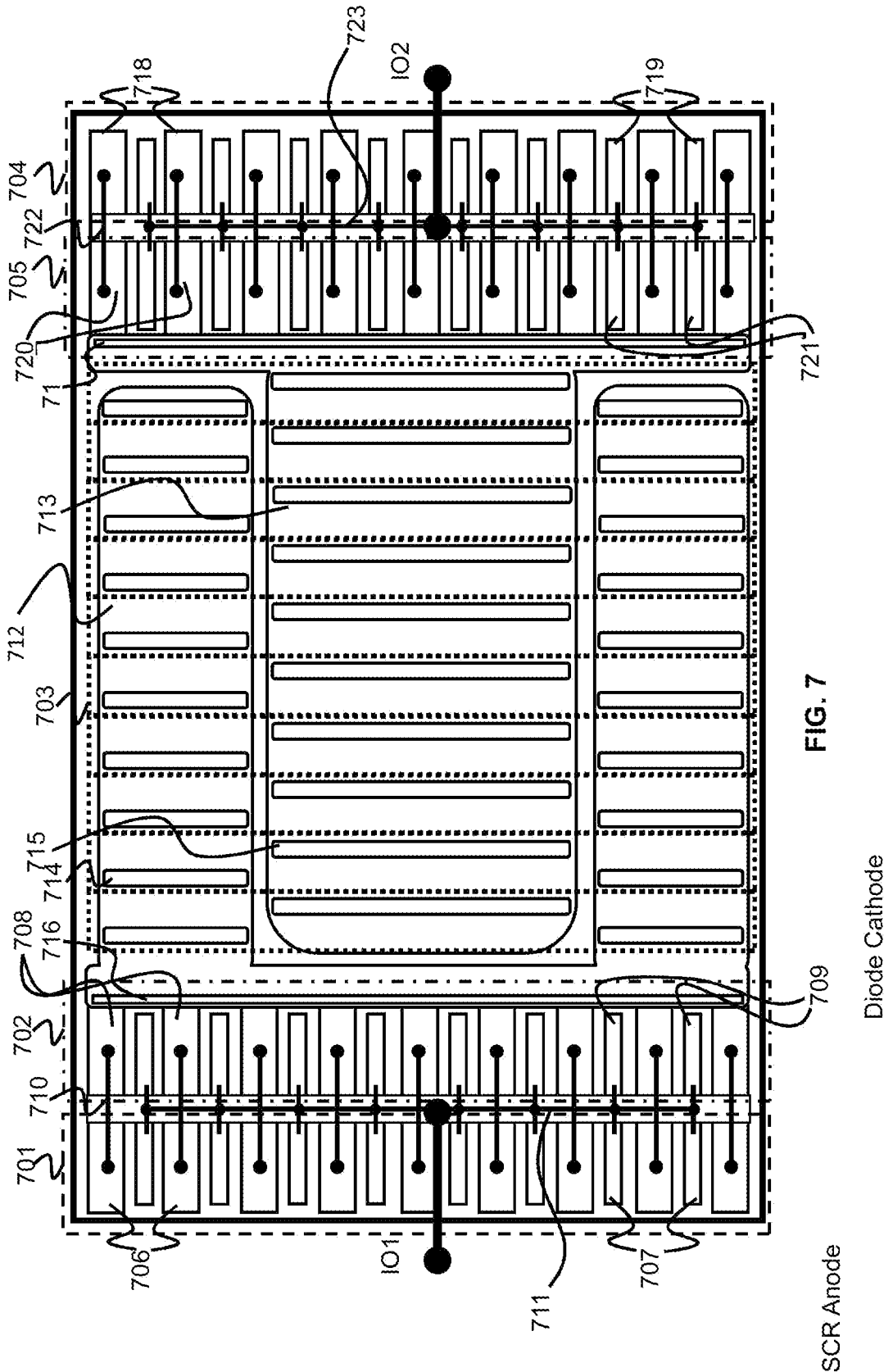
FIG. 7 is a top-down view of the improved high holding voltage TVS device showing an implementation of the top metallization, vias, and component area layout according to aspects of the present disclosure.

FIG. 7 is a top-down view of the improved TVS device showing an implementation of the top metallization, vias, and component area layout according to aspects of the present disclosure. As shown the improved TVS device includes separate areas for first a SCR 701, a first diode 702, a voltage clamp 703, a second SCR 704 and a second diode 705. The first SCR 701 includes separate regions for the first SCR anode 706 interdigitated with the first SCR cathode 707 arranged along a length of the top of the substrate composition. A portion of a top metal layer 711 connects each of the first SCR cathode regions 707 to the first I/O terminal IO1. These connections may be made using for example and without limitation a contact pad on the surface of the device to which the protected device is connected. Each first SCR cathode region of the first SCR cathode region 707 may be adjacent to a first diode anode region of the first anode regions 706 along the width of the substrate composition and may be connected using the top metal layer 711. Vias through an insulation layer on the top surface of the substrate composition may allow the top metal layer 711 to make contact with the different regions of the first SCR areas and first diode areas. The first diode area 702 is adjacent to the first SCR area 701 along the width of the TVS device. The first diode area includes first diode cathode regions 708 interdigitated with first diode anode regions 709 arranged along a length of the top of the substrate composition. Each first diode cathode region of the first diode cathode regions 708 are connected 710 to a first SCR anode region of the first SCR anode regions 706 which are located adjacent to each other along a width of the TVS device. Each connection 710 between first SCR anode and first diode cathode may be made by, for example and without limitation, a top metal layer. In the implementation connecting the first SCR anode region with the first diode cathode region with a top metal layer the top metal layer may make contact with the regions through a via and may be insulated from the surface of the substrate composition and other metal layers such as the layer connecting the first SCR cathode regions and the first diode anode regions. The insulation between the metal layers and the surface of the substrate composition may be for example and without limitation a layer of silicon dioxide formed on the top surface of the substrate composition.

A second SCR area 704 includes separate regions for the second SCR anode 718 interdigitated with the second SCR cathode 719 arranged along a length of the top of the substrate composition. A portion of the top metal layer connects 723 each of the second SCR cathode regions 719 to the second I/O terminal IO2, this connection may be made using for example and without limitation a contact pad on the surface of the device to which the protected device is connected. Each second SCR cathode region of the second SCR cathode regions 719 may be adjacent to a second diode anode region of the second anode regions 721 along the width of the substrate composition and may be connected using the top metal layer 723. Vias through the insulation layer on the top surface of the substrate composition may allow the top metal layer 723 to make contact with the different regions of the first SCR areas and first Diode areas. The second diode area 705 is adjacent to the second SCR area 704 along a width of the TVS device. The second diode area includes second diode cathode regions 720 interdigitated with second diode anode regions 721 arranged along a length of the top of the substrate composition. Each second diode cathode region of the second diode cathode regions 720 are connected 722 to a second SCR anode region of the second SCR anode regions 718 which are located adjacent to each other along a width of the TVS device. Each connection 722 between the second SCR anode and second diode cathode may be made by, for example and without limitation a top metal layer. In the implementation connecting the second SCR anode region with the second diode cathode region with a top metal layer the top metal layer may make contact with the regions through a via and may be insulated from the surface of the substrate composition and other metal layers such as the layer connecting the first SCR cathode regions and the first diode anode regions.

A voltage clamp first terminal metal 712 may be formed over top of the voltage clamp regions. An insulation layer may insulate the first terminal metal from the top surface of the voltage clamp 703. First Terminal Vias 714 through the insulation layer may allow the first terminal metal to make contact with terminal regions of the voltage clamp. The second terminal metal 713 is insulated from the first terminal metal and from the top surface of the substrate composition. Second Terminal vias 715 through the insulation layer on the top surface of the substrate composition allow the second terminal metal 713 to make contact with the second terminal regions of the voltage clamp. As shown the voltage clamp region is divided into cells with two vias for the first terminal and one via for the second terminal. The first terminal vias 712 are half the size of the second terminal vias to compensate for having twice the number of first terminal vias 712 as second terminal vias 713. Additionally, the first terminal metal 712 may have two prongs that straddle a single prong of the emitter metal 713. Each of the two prongs of the first terminal metal 712 may be half the length of the second terminal metal 713. As shown the first terminal metal 712 is connected to each of the first diode cathode regions 708 through one or more first diode terminal vias 716 running along the length of the first terminal metal 712.

The second terminal metal 713 is connected to each of the second diode cathode regions through one or more second terminal diode vias 717 running along the length of the second terminal metal 713. While implementations discussed herein provide for prongs of the first terminal metal straddling a prong of the second terminal metal, aspects of the present disclosure are not so limited and may include any number of prongs for both the first terminal metal and second terminal metal as long as the connections to the terminals in the substrate composition are balanced.

As discussed above the use of a voltage clamp with SCRs connected to the terminal provides for an improved ability to modify the reverse breakdown voltage and snapback voltages in the TVS device because these properties are no longer interlinked. Thus the present devices may have a high holding voltage or snap back voltage with a low capacitance, providing an improvement over previous devices which were neither as customizable nor were able to have a high snapback voltage without also having a high breakdown voltage.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A transient voltage suppressing (TVS) device comprising:

a first silicon-controlled rectifier, wherein the first silicon-controlled rectifier includes an intrinsic diode, and the intrinsic diode acts as a low side steering diode for current from the voltage clamp;

a voltage clamp having a first terminal and a second terminal, wherein the first terminal is connected to an anode of the first silicon-controlled rectifier; and a low side steering diode connected in parallel with the first silicon-controlled rectifier wherein a cathode of the low side steering diode is connected to the anode of the first silicon-controlled rectifier and the first terminal of the voltage clamp.

2. The TVS device of claim 1 wherein the voltage clamp is a PNP transistor, an NPN transistor or a silicon-controlled rectifier.

3. A transient voltage suppressing (TVS) device comprising:

a first silicon-controlled rectifier, wherein the first silicon-controlled rectifier includes an intrinsic diode, and the intrinsic diode acts as a low side steering diode for current from the voltage clamp; and a voltage clamp having a first terminal and a second terminal, wherein the first terminal is connected to an anode of the first silicon-controlled rectifier.

4. The TVS device of claim 1 wherein the low side steering diode is configured to have a low capacitance.

5. The TVS device of claim 1 wherein the first silicon-controlled rectifier and the low side steering diode are formed from the same substrate composition.

6. The TVS device of claim 1 further comprising a second silicon-controlled rectifier; and wherein the second terminal is connected to an anode of the second silicon-controlled rectifier.

7. The TVS device of claim 6 wherein the second silicon-controlled rectifier includes an intrinsic diode, and wherein the intrinsic diode acts the low side steering diode for current from the voltage clamp.

8. The TVS device of claim 6 wherein the first silicon-controlled rectifier and the second silicon-controlled rectifier are formed from the same substrate composition.

9. The TVS device of claim 6 further comprising a low side steering diode connected in parallel with the second silicon-controlled rectifier wherein the cathode of the low side steering diode is connected to the anode of the second silicon-controlled rectifier and the second terminal of the voltage clamp.

10. The TVS device of claim 9 wherein the low side steering diode, the first silicon-controlled rectifier and the second silicon-controlled rectifier are formed from the same substrate composition.

11. The TVS device of claim 6 further comprising one or more additional silicon-controlled rectifiers having an anode connected to either the first terminal of the voltage clamp or the second terminal of the voltage clamp.

12. The TVS device of claim 1 wherein first silicon-controlled rectifier is configured to have low capacitance and the voltage clamp is configured to have a floating base and holding voltage between 3 to 16 volts.

13. The TVS device of claim 1 wherein the voltage clamp is a PNP transistor or NPN transistor and the first terminal is a collector, and the second terminal is an emitter or the first terminal is the emitter, and the second terminal is the collector.

14. The TVS device of claim 1 wherein the voltage clamp is a symmetric silicon-controlled rectifier, and wherein the first terminal is an anode, and the second terminal is a cathode or the first terminal is a cathode and the second terminal is an anode.

15. The TVS device of claim 1 wherein the voltage clamp is configured to have a holding voltage between 3 to 300 volts.

* * * * *